(12) United States Patent
Lin et al.

(10) Patent No.: US 7,439,626 B2
(45) Date of Patent: Oct. 21, 2008

(54) POST PASSIVATION INTERCONNECTION SCHEMES ON TOP OF IC CHIP

(75) Inventors: Mou-Shiung Lin, Hsin-Chu (TW); Jin-Yuan Lee, Hsin-Chu (TW)

(73) Assignee: MEGICA Corporation, Hsin-Chu (TW)

( * ) Notice: Subject to any disclaimer, the term of this patent is extended or adjusted under 35 U.S.C. 154(b) by 0 days.

(21) Appl. No.: 11/856,075

(22) Filed: Sep. 17, 2007

(65) Prior Publication Data

US 2008/0001294 A1    Jan. 3, 2008

Related U.S. Application Data

(60) Continuation of application No. 11/273,071, filed on Nov. 14, 2005, which is a continuation of application No. 10/653,628, filed on Sep. 2, 2003, which is a continuation of application No. 10/278,106, filed on Oct. 22, 2002, now Pat. No. 6,734,563, which is a division of application No. 09/691,497, filed on Oct. 18, 2000, now Pat. No. 6,495,442.

(51) Int. Cl.
*H01L 23/48* (2006.01)

(52) U.S. Cl. .................. 257/773; 257/690; 257/700; 257/774

(58) Field of Classification Search ............. 257/773, 257/690, 700, 774
See application file for complete search history.

(56) References Cited

U.S. PATENT DOCUMENTS

| 3,030,877 A | 4/1962 | McDuffie et al. |
| 4,423,547 A | 1/1984 | Farrar et al. |
| 4,670,091 A | 6/1987 | Thomas et al. |
| 5,055,907 A | 10/1991 | Jacobs |
| 5,083,187 A | 1/1992 | Lamson et al. |
| 5,106,461 A | 4/1992 | Volfson et al. |
| 5,108,950 A | 4/1992 | Wakabayashi et al. |
| 5,212,403 A | 5/1993 | Nakanishi et al. |

(Continued)

FOREIGN PATENT DOCUMENTS

EP    1039544    9/2000

(Continued)

OTHER PUBLICATIONS

"Influence of the Series of On-Chip Power Supply Buses on Internal Device Failure After ESD Stress", by H. Terletzki et al., IEEE Trans. On Elec. Devices, vol. 40, No. 11, Nov. 1993, pp. 2081-2083.

(Continued)

*Primary Examiner*—Long Pham

(57) ABSTRACT

A new method is provided for the creation of interconnect lines. Fine line interconnects are provided in a first layer of dielectric overlying semiconductor circuits that have been created in or on the surface of a substrate. A layer of passivation is deposited over the layer of dielectric, a thick second layer of dielectric is created over the surface of the layer of passivation. Thick and wide interconnect lines are created in the thick second layer of dielectric. The first layer of dielectric may also be eliminated, creating the wide thick interconnect network on the surface of the layer of passivation that has been deposited over the surface of a substrate.

16 Claims, 5 Drawing Sheets

U.S. PATENT DOCUMENTS

| | | | |
|---|---|---|---|
| 5,227,012 A | 7/1993 | Brandli et al. | |
| 5,300,461 A | 4/1994 | Ting | |
| 5,384,488 A | 1/1995 | Golshan et al. | |
| 5,416,356 A | 5/1995 | Staudinger et al. | |
| 5,468,984 A | 11/1995 | Efland et al. | |
| 5,478,773 A | 12/1995 | Dow et al. | |
| 5,501,006 A | 3/1996 | Gehman, Jr. et al. | |
| 5,635,767 A | 6/1997 | Wenzel et al. | |
| 5,659,201 A | 8/1997 | Wollesen | |
| 5,663,108 A | 9/1997 | Lin | |
| 5,686,764 A | 11/1997 | Fulcher | |
| 5,739,560 A | 4/1998 | Toyoda et al. | |
| 5,789,303 A | 8/1998 | Leung et al. | |
| 5,834,844 A | 11/1998 | Akagawa et al. | |
| 5,929,508 A | 7/1999 | Delgado et al. | |
| 6,020,640 A | 2/2000 | Efland et al. | |
| 6,030,877 A | 2/2000 | Lee et al. | |
| 6,040,604 A | 3/2000 | Lauvray et al. | |
| 6,117,782 A | 9/2000 | Lukanc et al. | |
| 6,144,100 A | 11/2000 | Shen et al. | |
| 6,146,958 A | 11/2000 | Zhao et al. | |
| 6,187,680 B1 | 2/2001 | Costrini et al. | |
| 6,200,888 B1 | 3/2001 | Ito et al. | |
| 6,229,221 B1 | 5/2001 | Kloen et al. | |
| 6,232,147 B1 | 5/2001 | Matsuki et al. | |
| 6,236,101 B1 | 5/2001 | Erdeljac et al. | |
| 6,271,127 B1 | 8/2001 | Liu et al. | |
| 6,294,425 B1 | 9/2001 | Hideki | |
| 6,303,423 B1 | 10/2001 | Lin | |
| 6,383,916 B1 | 5/2002 | Lin | |
| 6,416,958 B2 | 7/2002 | Vidovic et al. | |
| 6,455,885 B1 | 9/2002 | Lin | |
| 6,459,135 B1 | 10/2002 | Basteres et al. | |
| 6,465,879 B1 | 10/2002 | Taguchi | |
| 6,472,745 B1 | 10/2002 | Iizuka | |
| 6,495,442 B1 | 12/2002 | Lin et al. | |
| 6,501,169 B1 | 12/2002 | Aoki et al. | |
| 6,544,880 B1 | 4/2003 | Akram | |
| 6,545,354 B1 | 4/2003 | Aoki et al. | |
| 6,548,365 B2 | 4/2003 | Basteres et al. | |
| 6,605,528 B1 | 8/2003 | Lin et al. | |
| 6,636,139 B2 | 10/2003 | Tsai et al. | |
| 6,649,509 B1 | 11/2003 | Lin et al. | |
| 6,683,380 B2 | 1/2004 | Efland et al. | |
| 6,734,563 B2 | 5/2004 | Lin et al. | |
| 6,759,275 B1 | 7/2004 | Lee et al. | |
| 6,800,555 B2 | 10/2004 | Test et al. | |
| 2002/0017730 A1 | 2/2002 | Tahara et al. | |
| 2002/0109232 A1 | 8/2002 | Lin et al. | |
| 2002/0115282 A1 | 8/2002 | Lin et al. | |
| 2002/0158334 A1 | 10/2002 | Vu et al. | |
| 2003/0102551 A1 | 6/2003 | Kikuchi | |
| 2004/0089951 A1 | 5/2004 | Lin | |
| 2004/0166659 A1 | 8/2004 | Lin et al. | |
| 2005/0104177 A1 | 5/2005 | Lin et al. | |
| 2006/0049483 A1 | 3/2006 | Lin et al. | |
| 2006/0049524 A1 | 3/2006 | Lin et al. | |
| 2006/0049525 A1 | 3/2006 | Lin et al. | |
| 2006/0063378 A1 | 3/2006 | Lin et al. | |
| 2006/0076687 A1 | 4/2006 | Lin et al. | |

FOREIGN PATENT DOCUMENTS

JP  2000216264  8/2000

OTHER PUBLICATIONS

"Power Distribution Techniques for VLSI Circuits", by Song et al., IEEE Jrnl. of Solid-State Circuits, vol. sc-21, No. 1, Feb. 1986, pp. 150-156.

"Processing Thick multilevel Polyimide Films for 3-D Stacked memory", by Caterer et al., IEEE Trans. On Advanced Packaging, vol. 22, No. 2, May 1999, pp. 189-199.

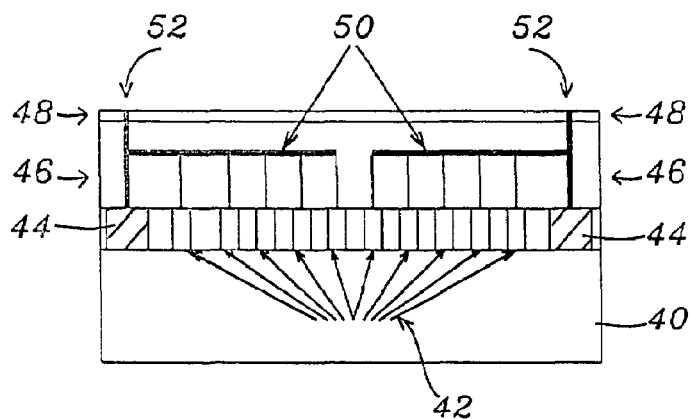
FIG. 1 – Prior Art
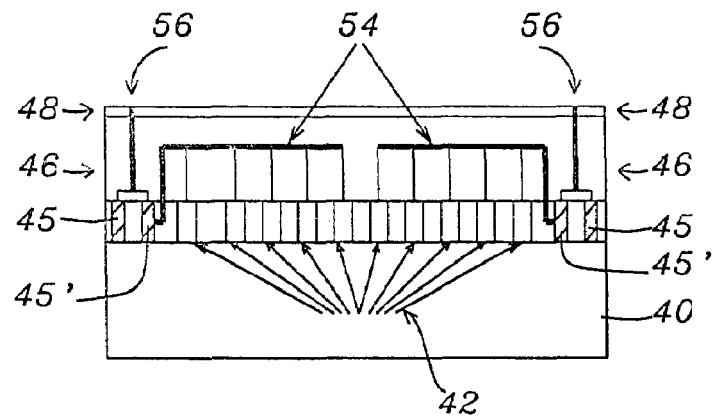
FIG. 2 – Prior Art
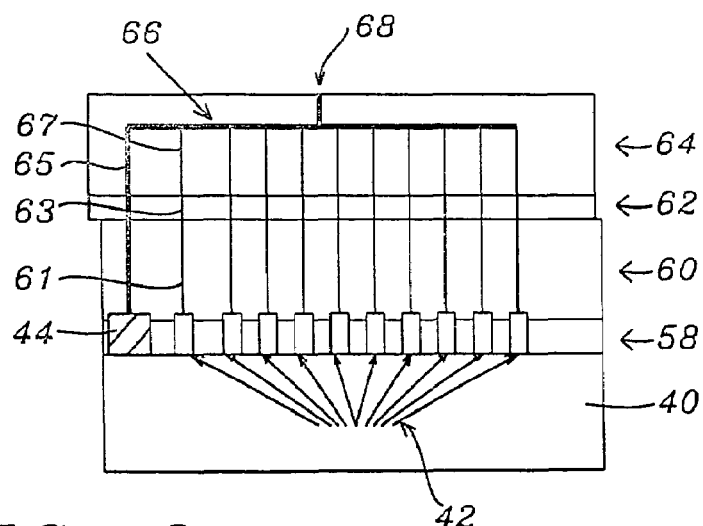
FIG. 3a

POST PASSIVATION INTERCONNECTION SCHEMES ON TOP OF IC CHIP

This application is a continuation of application Ser. No. 11/273,071, filed on Nov. 14, 2005, now pending, which is a continuation of application Ser. No. 10/653,628, filed on Sep. 2, 2003, now pending, which is a continuation of application Ser. No. 10/278,106, filed on Oct. 22, 2002, now U.S. Pat. No. 6,734,563, which is a division of application Ser. No. 09/691, 497, filed on Oct. 18, 2000, now U.S. Pat. No. 6,495, 442.

RELATED PATENT APPLICATIONS

This application is related to U.S. Ser. No. 09/251,183, filed on Feb. 17, 1999, now U.S. Pat. No. 6,383,916, which is a continuation-in-part of U.S. Ser. No. 09/216,791, filed on Dec. 21, 1998, now abandoned. This application is also related to U.S. Ser. No. 09/637,926, filed on Aug. 14, 2000, now abandoned.

BACKGROUND OF THE INVENTION (1) Field of the Invention

The invention relates to the fabrication of integrated circuit devices, and more particularly, to a method of post-passivation processing for the creation of conductive interconnects.

(2) Description of the Prior Art

Improvements in semiconductor device performance are typically obtained by scaling down the geometric dimensions of the Integrated Circuits; this results in a decrease in the cost per die while at the same time some aspects of semiconductor device performance are improved. The metal connections which connect the Integrated Circuit to other circuit or system components become of relative more importance and have, with the further miniaturization of the IC, an increasingly negative impact on the circuit-performance. The parasitic capacitance and resistance of the metal interconnections increase, which degrades the chip performance significantly. Of most concern in this respect is the voltage drop along the power and ground buses and the RC delay of the critical signal paths. Attempts to reduce the resistance by using wider metal lines result in higher capacitance of these wires.

To solve this problem, one approach has been to develop low resistance metal (such as copper) for the wires while low dielectric materials are used in between signal lines. Current practice is to create metal interconnection networks under a layer of passivation, this approach however limits the interconnect network to fine line interconnects, associated with parasitic capacitance and high line resistivity. The latter two parameters, because of their relatively high values, degrade device performance, resulting in even more severe effects for higher frequency applications and for long interconnect lines that are, for instance, used for clock distribution lines. Also, fine line interconnect metal cannot carry high values of current that is typically needed for ground busses and for power busses.

It has previously been stated that it is of interest to the semiconductor art to provide a method of creating interconnect lines that removes typical limitations that are imposed on the interconnect wires, such as unwanted parasitic capacitances and high interconnect line resistivity. The invention provides such a method. An analogy can be drawn in this respect whereby the currently (prior art) used fine-line interconnection schemes, which are created under a layer of passivation, are the streets in a city; in the post-passivation interconnection scheme of the present invention, the interconnections that are created above a layer of passivation can be considered the freeways between cities.

FIG. 1 shows a cross section of a silicon substrate on the surface of which has been created a conductive interconnect network. The structure that is shown in cross section in FIG. 1 addresses only and is limited to prior art power and ground distribution networks. The various features that have been highlighted in FIG. 1 are the following:

40, a silicon substrate on the surface of which has been created an interconnect network 42, a sample number of semiconductor circuits that have been created in or on the surface of the substrate 40

44, two electrostatic discharge (ESD) circuits created in or on the surface of the substrate 40; one ESD circuit is provided for each pin that is accessible for external connections (pins 52, see below)

46 is a layer in which interconnect lines are provided; these interconnect lines are above the surface of substrate 40 and under the layer 48 of passivation and represent a typical application of prior art fine-line interconnects; these fine-line interconnects in layer 46 typically have high resistivity and high parasitic capacitance 48 is a layer of passivation that is deposited over the surface of the layer 46 in which interconnect lines are provided 50 is a power or ground bus that connects to the circuits 42 via fine-line interconnect lines provided in layer 46; this power or ground bus 50 is typically of wider metal since this power or ground bus carries the accumulated current or ground connection for the devices 42

52 is a power or ground pin that passes through the layer 48 of passivation and that has been connected to the power or ground bus 50.

From the above the following can be summarized: circuits 42 and 44 are created in or on the surface of a silicon substrate 40, interconnect lines in layer 46 are created for these circuits 42 and 44 for further interconnection to external circuitry, the circuits 42 and 44 are, on a per I/O pin basis, provided with an ESD circuit 44, these circuits 42 together with the ESD circuit 44 are connected to a power or ground pin 52 that penetrates a layer 48 of passivation. The layer 48 of passivation is the final layer that overlies the created interconnect line structure, and the interconnect lines underneath the layer 48 of passivation are fine line interconnects and have all the electrical disadvantages of fine line interconnects such as high resistivity and high parasitic capacitance.

Relating to the cross section that is shown in FIG. 1, the following comments applies: ESD circuits 44 are, as is known-in the art, provided for the protection of semiconductor circuits 42 against unexpected electrical charges. For this reason, each pin that connects to a semiconductor circuit 42 must be provided with an ESD circuit 44.

FIG. 2 shows a cross section of a prior art configuration that resembles the cross section shown in FIG. 1. The structure that is shown in cross section in FIG. 2 however addresses only and is limited to clock and signal distribution networks. FIG. 2 shows in addition (to the previously highlighted aspects of FIG. 1):

45 are two ESD circuits that are provided in or on the surface of the substrate 40; ESD circuits 45 are always required for any external connection to an input/output (I/O) pin 56

45' which are circuits that can be receiver or driver or I/O circuits for input (receiver) or output (driver) or I/O purposes respectively 54 is a clock bus 56 is a clock or signal pin that has been extended through the layer 48 of passivation.

The same comments apply to the cross section that is shown in FIG. 2 as previously have been made with respect to FIG. 1, with as a summary statement that the layer 48 of passivation is the final layer that overlies the created structure, and the interconnect lines in layer 46 underneath the layer 48 of passivation are fine line interconnects and have all the electrical disadvantages of fine line interconnects such as high resistivity and high parasitic capacitance.

Further applies to the cross section that is shown in FIG. 2, where pins 56 are signal or clock pins:

pins 56 must be connected to ESD circuits 45 and driver/receiver or I/O circuits 45' for signal or clock pins 56, these pins 56 must be connected not only to ESD circuits 45 but also to driver or receiver or I/O circuits, highlighted as circuits 45' in FIG. 2 after (clock and signal) stimuli have passed through the ESD circuits 45 and driver/receiver or I/O circuits 45', these stimuli are further routed using, under prior art methods, fine-line interconnect wires in layer 46. A layer 48 of passivation is deposited over the dielectric layer 46 in which the interconnect network has been created.

It is therefore of interest to the semiconductor art to provide a method of creating interconnect lines that removes typical limitations that are imposed on the interconnect wires, such as unwanted parasitic capacitances and high interconnect line resistivity.

SUMMARY OF THE INVENTION

A principal objective of the invention is to provide a method for the creation of interconnect metal that allows for the use of thick and wide metal.

Another objective of the invention is to provide a method for the creation of interconnect metal that uses the application of thick layer of dielectric such as polymer.

Yet another objective of the invention is to provide a method that allows for the creation of long interconnect lines, whereby these long interconnect lines do not have high resistance or introduce high parasitic capacitance.

A still further objective of the invention is to create interconnect lines that can carry high values of current for the creation of power and ground distribution networks.

A still further objective of the invention is to create interconnect metal that can be created using cost effective methods by creating the interconnect metal over a layer of passivation after the layer of passivation has been deposited.

In accordance with the objectives of the invention a new method is provided for the creation of interconnect lines. Fine line interconnects are provided in a first layer of dielectric overlying semiconductor circuits that have been created in or on the surface of a substrate. A layer of passivation is deposited over the layer of dielectric; a thick second layer of dielectric is created over the surface of the layer of passivation. Thick and wide interconnect lines are created in the thick second layer of dielectric.

BRIEF DESCRIPTION OF THE DRAWINGS

FIG. 1 is a cross section of a silicon substrate over which a prior art fine-line interconnect network is created over which a layer of passivation is deposited; power and/or ground pins are provided through the layer of passivation for external connection. The structure that is shown in cross section in FIG. 1 addresses only and is limited to prior art power and ground distribution networks.

FIG. 2 is a cross section of a silicon substrate over which a prior art fine-line interconnect network is created over which a layer of passivation is deposited; clock and/or signal pins are provided through the layer of passivation for external connection. The structure that is shown in cross section in FIG. 2 addresses only and is limited to prior art clock and signal distribution networks.

FIG. 3a is a cross section of a silicon substrate over which an interconnect network is created according to the invention. Power and/or ground pins are provided through the layer of passivation for external connection. The structure that is shown in cross section in FIGS. 3a and 3b addresses only and is limited to power and ground distribution networks of the invention.

DESCRIPTION OF THE PREFERRED EMBODIMENTS

Figure 6:
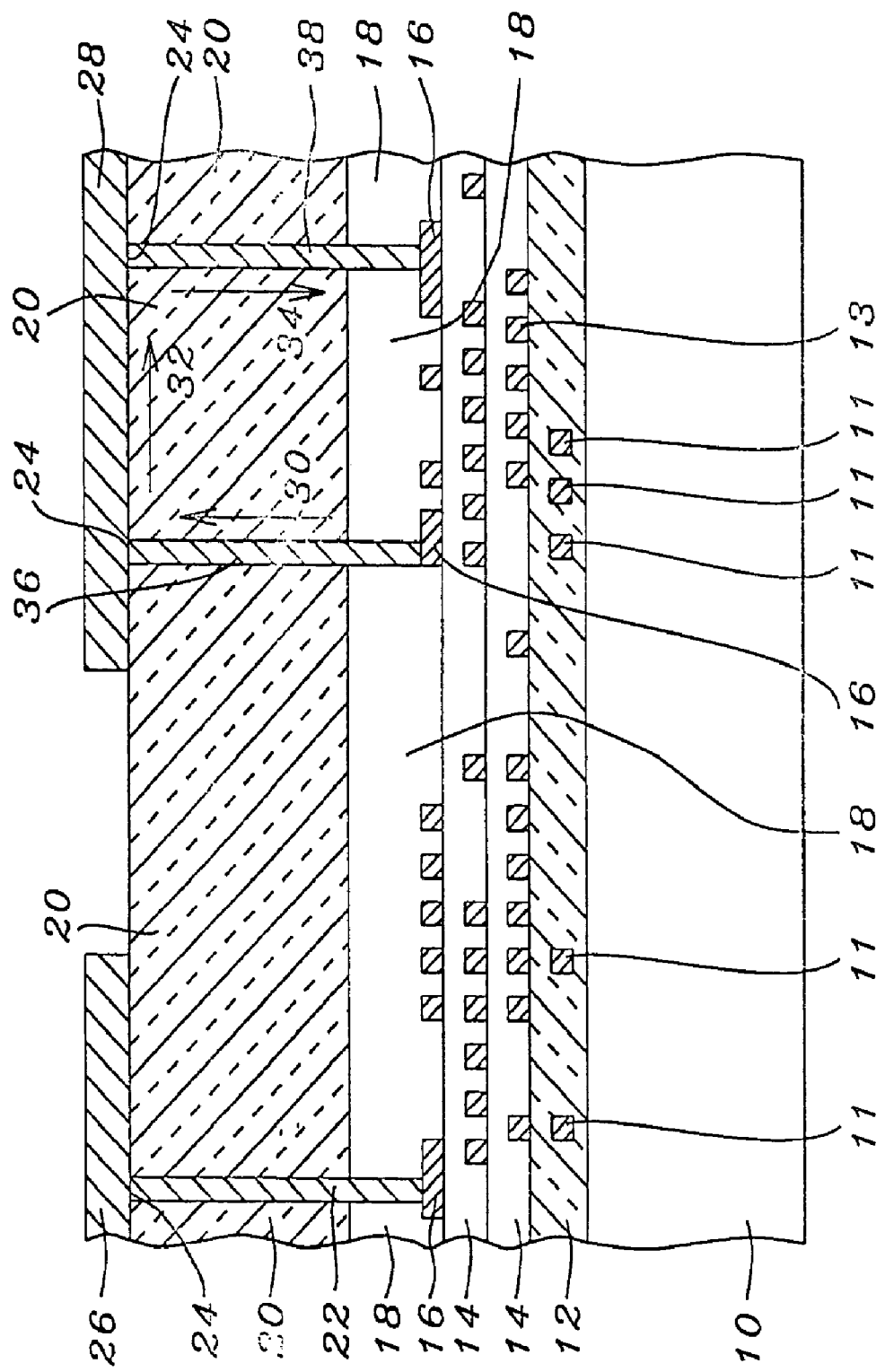
FIG. 6 shows a cross section of the interconnection scheme of the referenced application invention.

For purposes of reference and for clarity of understanding, FIG. 6 is taken from related U.S. application Ser. No. 09/251,183 and is herein incorporated by reference.

Referring now more specifically to FIG. 6, there is shown a cross section of one implementation of the referenced application. The surface of silicon substrate 10 has been provided with transistors and other devices (not shown in FIG. 6). The surface of substrate 10 is covered by a dielectric layer 12, layer 12 of dielectric is therefore deposited over the devices that have been provided in the surface of the substrate and over the substrate 10. Conductive interconnect lines 11 are provided inside layer 12 that connect to the semiconductor devices that have been provided in the surface of substrate 10.

Layers 14 (two examples are shown) represent all of the metal layers and dielectric layers that are typically created on top of the dielectric layer 12. Layers 14 that are shown in FIG. 6 may therefore contain multiple layers of dielectric or insulation and the like, conductive interconnect lines 13 made up of the network of electrical connections that are created throughout layers 14. Overlying and on the surface of layers 14 are points 16 of electrical contact. These points 16 of electrical contact can for instance be bond pads that establish the electrical interconnects to the transistors and other devices that have been provided in the surface of the substrate 10. These points of contact 16 are points of interconnect within the IC arrangement that need to be further connected to surrounding circuitry. A passivation layer 18, formed of for example silicon nitride, is deposited over the surface of layer 14 to protect underlying layers from moisture, contamination, etc.

The key steps of the above referenced application begin with the deposition of a thick layer 20 of polyimide that is deposited over the surface of layer 18. Access must be provided to points of electrical contact 16, for this reason a pattern of openings 22, 36 and 38 is etched through the polyimide layer 20 and the passivation layer 18. The pattern of openings 22, 36 and 38 aligns with the pattern of electrical contact points 16. Contact points 16 are, by means of the openings 22/36/38 that are created in the layer 20 of polyimide, electrically extended to the surface of layer 20.

The above referenced material that is used for the deposition of layer 20 is polyimide; the material that can be used for this layer is not limited to polyimide but can contain any of the known polymers ($SiCl_xO_y$). The indicated polyimide is the preferred material to be used for the processes of the invention for the thick layer 20 of polymer. Examples of polymers that can be used are silicons, carbons, fluoride, chlorides, oxygens, silicone elastomer, parylene or teflon, polycarbonate (PC), polysterene (PS), polyoxide (PO), poly polooxide (PPO), benzocyclobutene (BCB).

Electrical contact contacting with the contact points 16 can now be established by filling the openings 22/36/38 with a conductive material. The top surfaces 24 of these metal conductors that are contained in openings 22/36/38 can now be used for connection of the IC to its environment, and for further integration into the surrounding electrical circuitry. The semiconductor devices that have been provided in the surface of substrate 10 can, via the conductive interconnects contained in openings 22/36/38, be further connected to surrounding components and circuitry. Interconnect pads 26 and 28 are formed on top of surfaces 24 of the metal interconnects contained in openings 22, 36 and 38. These pads 26 and 28 can be of any design in width and thickness to accommodate specific circuit design requirements. A pad 26 or 28 can, for instance, be used as a flip chip pad. Other pads 26 or 28 can be used for power distribution or as a ground or signal bus. The following connections can, for instance, be made to the pads shown in FIG. 6: pad 26 can serve as a flip chip pad, and pad 28 can serve as a flip chip pad or can be connected to electrical power or to electrical ground or to an electrical signal bus. Pad size and the standard rules and restrictions of electrical circuit design determine the electrical connections to which a given pad 26 or 28 lends itself.

The following comments relate to the size and the number of the contact points 16, as shown in FIG. 6. Because these contact points 16 are located on top of a thin dielectric (layer 14, FIG. 6) the pad size cannot be too large since a large pad size brings the circuits a large capacitance. In addition, a large pad size will interfere with the routing capability of that layer of metal. It is therefore preferred to keep the size of the pad 16 relatively small. The size of pad 16 is however also directly related with the aspect ratio of vias 22/36/38. An aspect ratio of about 5 is acceptable for the consideration of via etching and via filling. Based on these considerations, the size of the contact pad 16 can be in the order of 0.5 μm to 30 μm, the exact size being dependent on the thickness of layers 18 and 20.

For higher aspect ratio vias, the vias are filled with via plugs before the deposition of the metal layers 26 and 28. However, for vias that have lower aspect ratios (for example less than 2), the via plugs may not be needed in which case the metal of layers 26 and 28 can directly establish contact with the pads 16.

The referenced application does not impose a limitation on the number of contact pads that can be included in the design, this number is not only dependent on package design requirements but is mostly dependent on the internal circuit design requirements. Layer 18 in FIG. 6 can be a typical IC passivation layer.

The most frequently used passivation layer in the present state of the art is plasma enhanced CVD (PECVD) oxide and nitride. In creating layer 18 of passivation, a layer of approximately 0.5 μm PECVD oxide can be deposited first followed by a layer of approximately 0.7 μm nitride. Passivation layer 18 is very important because it protects the device wafer from moisture and foreign ion contamination. The positioning of this layer between the sub-micron process (of the integrated circuit) and the tens-micron process (of the interconnecting metallization structure) is of critical importance since it allows for a cheaper process that possibly has less stringent clean room requirements for the process of creating the interconnecting metallization structure.

Layer 20 is a thick polymer dielectric layer (for example polyimide) that has a thickness in excess of 2 μm (after curing). The range of the polymer thickness can vary from 2 μm to 150 μm, dependent on electrical design requirements.

For the deposition of layer 20 the Hitachi-Dupont polyimide HD 2732 or 2734 can, for example, be used. The polyimide layer 20 can be spin-on coated and cured. After spin-on coating, the polyimide layer 20 will be cured at 400 degrees C. for 1 hour in a vacuum or nitrogen ambient. For thicker polyimide film 20, the polyimide film 20 can be multiple coated and cured.

Another material that can be used to create layer 20 is the polymer benzocyclobutene (BCB). This polymer is at this time commercially produced by for instance Dow Chemical and has recently gained acceptance to be used instead of typical polyimide application.

The dimensions of openings 22, 36 and 38 have previously been discussed. The dimension of the opening together with the dielectric thickness determines the aspect ratio of the opening. The aspect ratio challenges the via etch process and the metal filling capability. This leads to a diameter for openings 22/36/38 in the range of from approximately 0.5 μm to 30 μm. The height for openings 22/36/38 can be in the range of approximately 2 μm to 150 μm. The aspect ratio of openings 22/36/38 is designed such that filling of the via with metal can be accomplished. The via can be filled with CVD metal such as CVD tungsten or CVD copper, with electro-less nickel, with a damascene metal filling process, with electroplating copper, etc. As previously stated, for low aspect ratio vias, the filling of the vias is not required as an extra processing step. A direct contact can be established between the metal layers 26 and 28 and the contact pads 16.

The referenced application can be further extended by applying multiple layers of polymer (such as polyimide) and can therefore be adapted to a larger variety of applications. The function of the structure that has been described in FIG. 6 can be further extended by depositing a second layer of polyimide on top of the previously deposited layer 20 and overlaying the pads 26 and 28. Selective etching and metal deposition or electro plating of metal can further create additional contact points on the surface of the second layer of polyimide that can be interconnected with pads 26 and 28. Additional layers of polyimide and the thereon created contact pads can be customized to a particular application; the indicated extension of multiple layers of polyimides greatly enhances the flexibility and usefulness of the referenced application.

FIG. 6 shows a basic design advantage of the referenced application. This advantage allows for the sub-micron or fine-lines that run in the immediate vicinity of the metal layers 14 and the contact points 16 to be extended in an upward direction 30 through metal interconnect in the opening 36; this extension continues in the direction 32 in the horizontal plane of the metal interconnect 28 and comes back down in the downward direction 34 through metal interconnect in the opening 38. The functions and constructs of the passivation layer 18 and the insulating layer 20 remain as previously highlighted. This basic design advantage of the invention is to "elevate" or "fan-out" the fine-line interconnects and to remove these interconnects from the micro and sub-micro level to a metal interconnect level that has considerably larger dimensions and that therefore has smaller resistance and capacitance and is easier and more cost effective to manufacture. This aspect of the referenced application does not include any aspect of pad re-distribution and therefore has an inherent quality of simplicity. It therefore further adds to the importance of the referenced application in that it makes micro and sub-micro wiring accessible at a wide and thick metal level. The interconnections in the openings 22, 36 and 38 interconnect the fine-level metal by going up through the passivation and polymer or polyimide dielectric layers 18 and 20, continuing through the wide and thick metal level on the polymer layer 20 for a distance, and continuing by descending from the wide and thick metal level back down to the fine-metal level by again passing down through the passivation and polymer or polyimide dielectric layers 18 and 20. The extensions that are in this manner accomplished can extend fine-metal interconnect points 16 of any particular type, such as signal point or power point or ground point, to wide and thick metal line 26 and 28. The laws of physics and electronics will impose limitations, if any, to the interconnect established in this manner, and the limiting factors will be the conventional electrical limiting factors of resistance, propagation delay, RC constants and others. What in the referenced application is of importance is that the referenced application provides much broader latitude in being able to apply these laws and provides a considerably extended scope of the application and use of Integrated Circuits and the adaptation of these circuits to a wide and thick metal environment.

This completes the discussion of the construct shown for purposes of reference in FIG. 6. Following will further be discussed the cross sections that are shown in FIGS. 7a and 7b.

Figure 7A:
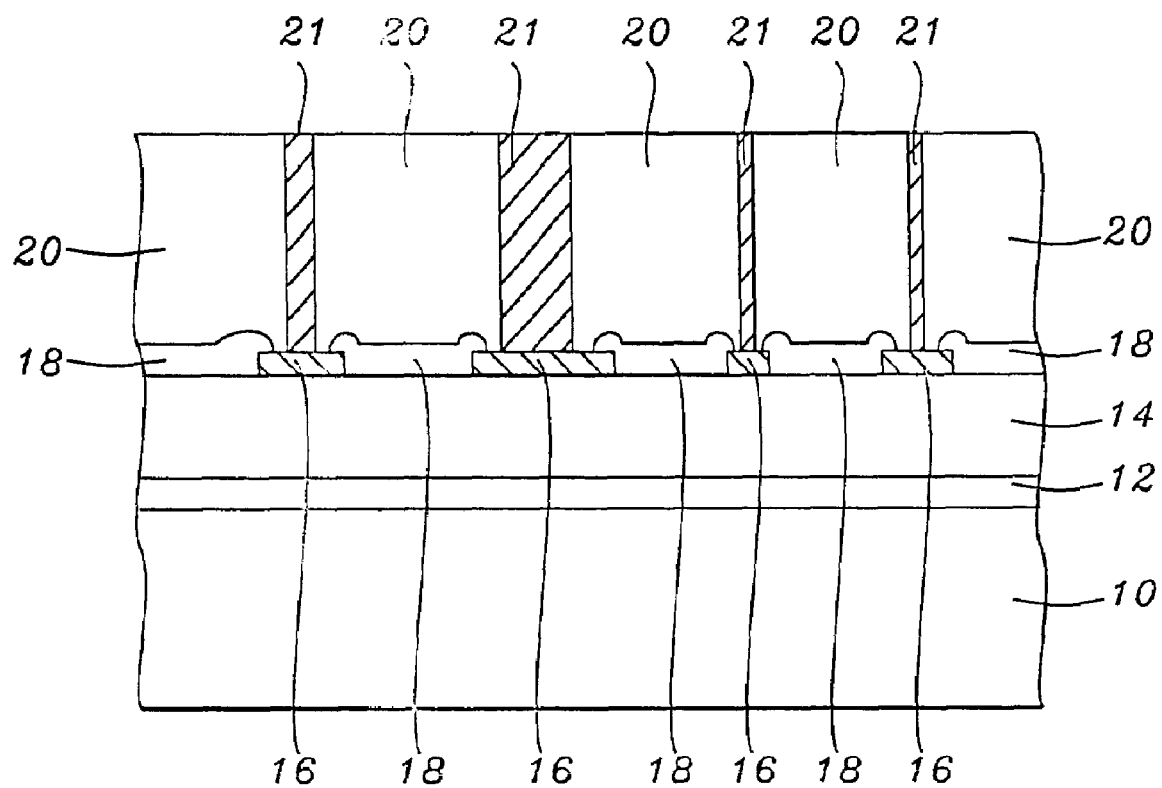
FIG. 7a shows a cross section of a simplified version of the substrate and the layers that are created on the surface of the substrate under the processes of the referenced application.
Figure 7B:
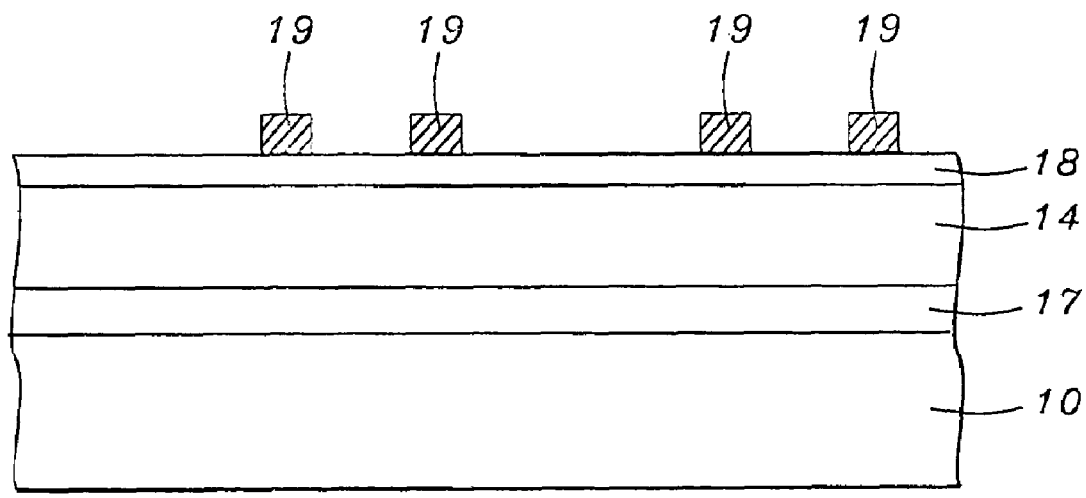
FIG. 7b shows an inductor has been added above the layer of passivation.

FIG. 7a shows, for reasons of clarity, a simplified cross section of the substrate and the layers that are created on the surface of the substrate under the processes of the invention; the highlighted areas that are shown have previously been identified as:

10 the silicon substrate 12 is a layer of dielectric that has been deposited over the surface of the substrate 10

14 is an interconnect layer that contains interconnect lines, vias and contact points 16 are the contact points on the surface of the interconnect layer 14

18 is a layer of passivation into which openings have been created through which the contact points 16 can be accessed 20 is a thick layer of polymer, and 21 are the conductive plugs that have been provided through the layer 20 of polyimide.

The thick layer 20 of polymer can be coated in liquid form on the surface of the layer 18 of passivation or can be laminated over the surface of layer 18 of passivation by dry film application. Vias that are required for the creation of conductive plugs 21 can be defined by conventional processes of photolithography or can be created using laser (drill) technology.

It is clear from previous discussions that the structure of layers that is shown in cross section in FIG. 7a has been created so that additional electrical components such as an inductor, a capacitor and the like can be created on the surface of layer 20 of polyimide and in electrical contact with conductive plugs 21. Layer 12 of dielectric may, in the cross section that is shown in FIG. 7a, be part of layer 14 since layer 14 is a layer of Intra Level Dielectric (ILD) within which layer 12 can be readily integrated.

With respect to the cross section that is shown in FIG. 7b, the same layers that have been identified for FIG. 7a are again provided in this cross section. Additionally has been shown the upper layer 17 of the silicon substrate 10 that contains active semiconductor devices. Also shown is cross section of an inductor 19 that has been created on the surface of layer 18 of passivation. It must again be emphasized that the ohmic resistivity of the metal that is used for the inductor 19 must be as low as possible. For this reason, the use of a thick layer of metal, for instance gold, is preferred for the formation of inductor 19, and it has been shown that a thick layer of gold, increases the Q value of inductor 19 from about 5 to about 20 for 2.4 GHz applications, which represents a significant improvement in the Q value of inductor 19.

Referring now specifically to FIG. 3a, this figure refers only to power and ground pins and does not address signal or clock pins. There is shown in FIG. 3a a cross section of a silicon substrate 40 over which an interconnect network is created according to the invention, with a wide and thick wire interconnect network 66 created in a thick layer 64 of dielectric overlying a layer 62 of passivation. A power and/or ground pin 68 is provided through the thick layer 64 of dielectric for external connection. Following are the various features that are shown in FIG. 3a:

40 is the silicon substrate on the surface of which interconnect lines are created in accordance with the invention 42 are semiconductor circuits that are created in or on the surface of substrate 40

44 is an ESD circuit that is provided for the protection of circuits 42

58 is a layer in which connection pads are created to the semiconductor devices 42 that have been created in or on the surface of substrate 40

60 is a layer of dielectric in which fine-line interconnects have been created overlying the layer 58 in which the connection pads 58 are created to the semiconductor devices 42

61 is one of the vias that have been provided in layer 60; more such vias 61 are shown in FIG. 3a but are, for reasons of simplicity, not highlighted 62 is a layer of passivation that has been deposited overlying the layer 60 of dielectric in which fine-line interconnects are formed 63 is one of vias that passes through layer 62 of passivation; more such vias 63 are shown in FIG. 3a but are, for reasons of simplicity, not highlighted 64 is a layer of dielectric in which, as a post-passivation process, interconnects have been created 65 is a power or ground bus that is connected to the ESD circuit 44, originating in layer 64 and further passing through layers 62 and 60

66 is a power or ground bus providing power or ground (for multiple connection pads in layer 58)

67 is a via that is created overlying the layer 62 of passivation; more such vias 67 are shown in FIG. 3a but are, for reasons of simplicity, not highlighted

68 is a power or ground pin for the multiple semiconductor devices 42 in layer 58.

From the cross section that is shown in FIG. 3a, its is clear that, most importantly, the ability to create interconnects to semiconductor devices 42 that have been created in or on the surface of a substrate 40 has been extended by creating these interconnects not only as fine-line interconnects in layer 60 but extending the interconnect by creating a wide, thick wire interconnect network 66 overlying a layer 62 of passivation. This provides immediate and significant benefits in that the interconnect network 66 that is created overlying the layer 62 of passivation can now contain sturdier, that is thicker and wider, interconnect lines. The thick, wide metal interconnects 66 can be used for power and ground distribution, and this distribution 66 takes place above a layer 62 of passivation and partially replaces and extends the conventional method of having for these purposes a fine-line distribution interconnect network in layer 60 under the layer 62 of passivation.

Some points of interest can be listed at this time as they relate to prior art methods and to the invention.

PRIOR ART provides an ESD circuit for each pin that is used for external input/output interconnect provides, after ESD stimuli have passed through the ESD circuits, a fine-line interconnect network for further distribution of the power and ground stimuli, and the fine-line power and ground distribution network is created underneath a layer of passivation.

It must, in this respect and related to the above provided comments, be remembered that power and ground pins do not require drivers and/or receiver circuitry.

The invention:

does not need to create an ESD circuit for each pin that is used for external input/output interconnect, in view of the more robust wiring that drives the ESD circuit, resulting in reduced power loss by an unexpected power surge over the interconnect line, resulting in more power being delivered to the ESD circuit, and allows for the power and ground interconnects to be directly connected to the internal circuits of a semiconductor device, either without an ESD circuit or with a smaller than regular ESD circuit (as previously explained).

The method that is used to create the interconnect network that is shown in cross section in FIG. 3a addresses only the use of power and ground connections and does not apply to clock and signal interconnect lines. FIG. 3a can be summarized as follows: a silicon substrate 40 is provided in the surface of which have been created semiconductor devices 42 and at least one electrostatic discharge (ESD) circuit 44, a first layer 60 of dielectric is deposited over the substrate 40, and a fine-line interconnect network 61 is created in the first layer 60 of dielectric making contact with the active circuits 42 and the ESD circuit 44. A layer 62 of passivation is deposited over the surface of the first layer 60 of dielectric, and a pattern of metal plugs 63 is created in the layer 62 of passivation that aligns with points of contact created in the surface of the first layer 60 of dielectric. A second layer 64 of dielectric is deposited over the surface of the layer 62 of passivation, and a wide thick line interconnect network 66 is created in said the layer 64 of dielectric, connected to the ESD circuits 44. A point of electrical contact 68 comprising a power or ground contact is provided in the surface of said second layer 64 of dielectric. The ESD circuit 44 is connected, in parallel with the internal circuits 42, to an external connection point 68.

Figure 3B:
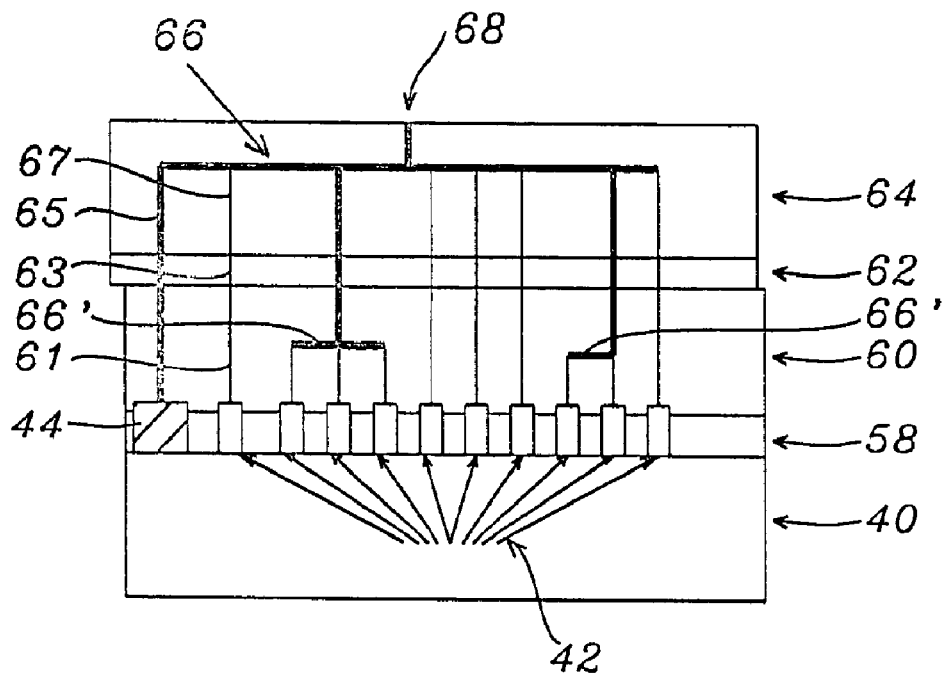
FIG. 3b shows power and ground distribution lines that are below a layer of passivation and power and ground distribution lines that are above a layer of passivation.

FIG. 3b provides further insight into the creation of the power and ground interconnect lines of the invention whereby these interconnect lines have been shown with interconnect lines 66 and interconnect lines 66'. Interconnect lines 66 have been created above the layer 62 of passivation and act as global power and ground interconnect lines. Interconnect lines 66' have been created below the layer 62 of passivation and act as local power and ground interconnect lines.

Figure 4A:
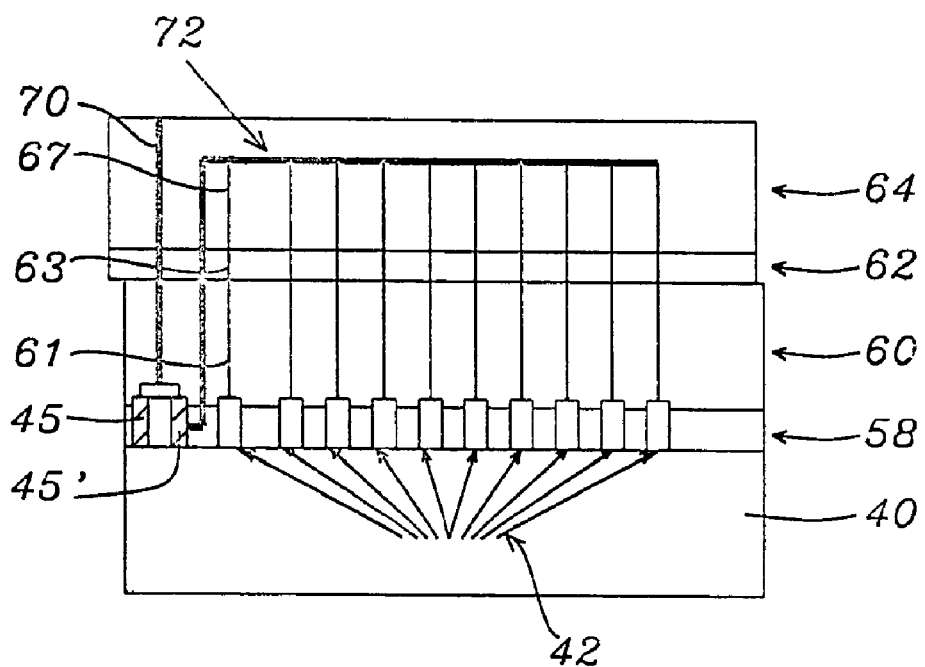
FIG. 4a is a cross section of a silicon substrate over which an interconnect network is created according to the invention. An ESD and/or driver and/or receiver circuit access pin is provided through the layer of dielectric for external connection. The structure that is shown in cross section in FIGS. 4a and 4b addresses only and is limited to clock and signal distribution networks of the invention.

Referring now to FIG. 4a, FIG. 4a addresses the interconnections of signal and clock line. In FIG. 4a there is shown a cross section of a silicon substrate 40 over which an interconnect network is created according to the invention. An access pin 70 to an ESD circuit 45 or driver circuits 45' or receiver circuits 45' or I/O circuits 45' is provided through the surface of the layer 64 of dielectric for external connection. The ESD circuit 45 is required for all circuits 42 to which an I/O connection 70 is established, and the I/O interconnect 70 can also be provided to a receiver circuit 45' or a driver circuit 45' or an I/O circuit 45'.

The features not previously highlighted in FIGS. 3a and 3b but shown in FIG. 4a are:

the invention provides an interconnect network comprising wide, thick interconnect lines 72 for distribution of the clock and signal stimuli the invention creates an interconnect network of thick, wide interconnect lines 72 for the clock and signal stimuli overlying a layer 62 of passivation,

70 is an external connection (pin) that is provided for the ESD circuit 45 and for driver/receiver/I/O circuit 45', and pin 70 provides an external access for clock and signal stimuli to circuits 45 and 45', and

72 is a clock or signal bus that is created in the dielectric layer 64 using thick, wide wires for interconnect lines; it must be noted that the clock and signal interconnect line distribution 72 is entirely contained within the layer 64 without providing an external point of I/O interconnect.

The method that is used to create the interconnect network that is shown in cross section in FIG. 4a can be summarized as follows. A silicon substrate 40 is provided, and active circuits 42, 45 and 45' have been created in the surface of the substrate 40 including an ESD circuit 45, receiver 45', driver 45' and I/O circuit 45'. First layers 60 of dielectric of inorganic material are deposited over the substrate 40, and a fine-line interconnect network 61 is created in the layers 60 of dielectric, making contact with the active circuitry 42, 45 and 45'. A layer 62 of passivation is deposited over the first thin layers 60 of dielectric, a pattern of metal plugs 63 is created in the layer 62 of passivation, and the metal interconnects 63 align with points of electrical contact in the surface of the first layers 60 of dielectric. One or more thicker layers 64 of dielectric are deposited over the surface of the layer 62 of passivation, typically of an organic material, and a wide thick line interconnect network 72 is created in the thicker layer 64 of dielectric, making electrical contact with the metal plugs 63 or the metal pads of the fine-line interconnect network 61 in or under the layer 62 of passivation, and connected to the semiconductor devices 42 and receiver 45', driver 45' or I/O circuit 45'. A point 70 of electrical contact is provided in the surface of the second layer 64 of dielectric and connected to the ESD circuit 45, and receiver 45', driver 45' or I/O circuit 45'. The driver, receiver or I/O circuit 45' is connected in series between the wide thick line interconnect network 72 and the external connection point 70. The ESD circuit 45 is connected, in parallel with the driver, receiver or I/O circuit 45', to the external connection point 70.

Figure 4B:
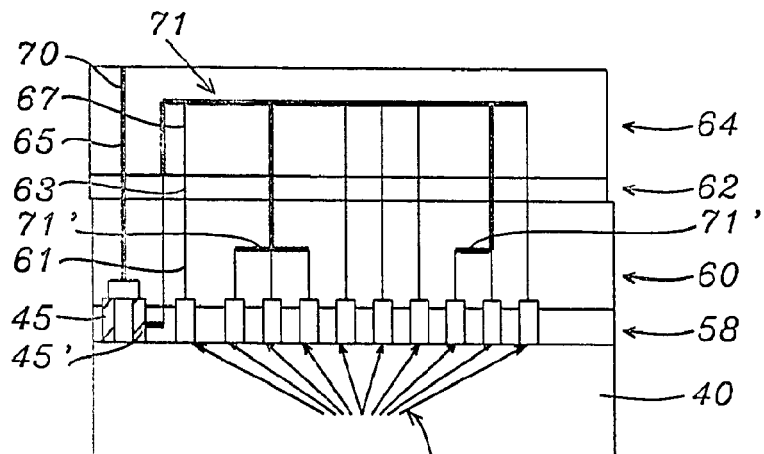
FIG. 4b shows clock and signal distribution lines that are below a layer of passivation and clock and signal distribution lines that are above a layer of passivation.

FIG. 4b provides further insight into the creation of the signal and clock interconnect lines of the invention whereby these interconnect lines have been shown with interconnect lines 71 and interconnect lines 71'. Interconnect lines 71 have been created above the layer 62 of passivation and act as global signal and clock interconnect lines. Interconnect lines 71 have been created below the layer 62 of passivation and act as local signal and clock interconnect lines.

Figure 5A:
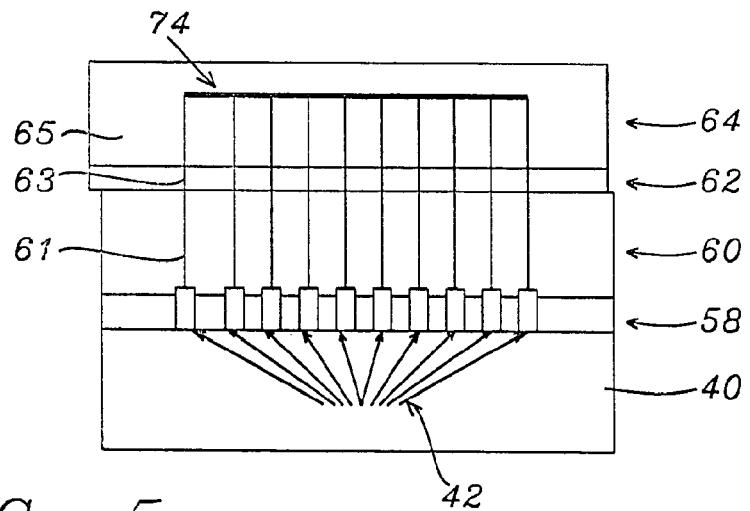
FIG. 5a is a cross section of a silicon substrate over which an interconnect network is created according to the invention. No I/O connect pin is provided through the layer of dielectric for external connection. The structure that is shown in cross section in FIGS. 4a and 4b addresses only and is limited to clock and signal distribution networks of the invention.

FIG. 5a shows a cross section of a silicon substrate 40 over which an interconnect network is created according to the invention, with the interconnect network 74 created in a thick layer 64 of dielectric overlying a layer 62 of passivation. No ESD, receiver, driver or I/O circuit access pin is provided through the surface of the layer 64 of dielectric for external connection. Shown in FIG. 5a and not previously highlighted is the clock or signal interconnect line 74, providing for an interconnect scheme of thick, wide lines overlying a passivation layer 62 whereby no external I/O connections are provided. Due to the thick, wide lines of the interconnect network 74 that is created overlying a passivation layer 62, the clock and signal distribution 74 can take place entirely within the layer 64, as opposed to prior art methods where, for clock and signal distribution lines, each thick, wide interconnect line (where such thick, wide interconnect lines are used) must be provided with at least one I/O connect point for off-chip connection.

The method that is used to create the wide thick interconnect lines that is shown in cross section in FIG. 5a can be summarized as follows and is similar to that described above for FIG. 4a. A silicon substrate 40 is provided, and active devices 42 have been provided in the surface of the substrate 40. First thin layers 60 of dielectric are deposited over the surface of the substrate 40, and a fine-line interconnect network 61 is created in the first layers 60 of dielectric comprising fine-line interconnect lines, making contact with points of electrical contact of the active devices 42 in the surface of the substrate 42. A layer 62 of passivation is deposited over the surface of the first layers 60 of dielectric, and a pattern of conductive interconnects 63 is created in the layer 62 of passivation that aligns with the points of electrical contact of the fine-line interconnect network 61 in the surface of the first layer 60 of dielectric. One or more second layers 64 of dielectric are deposited over the surface of the layer 62 of passivation, the interconnect network 74 in the second layers 64 of dielectric making electrical contact with the conductive interconnects 63 in the layer 62 of passivation.

Figure 5B:
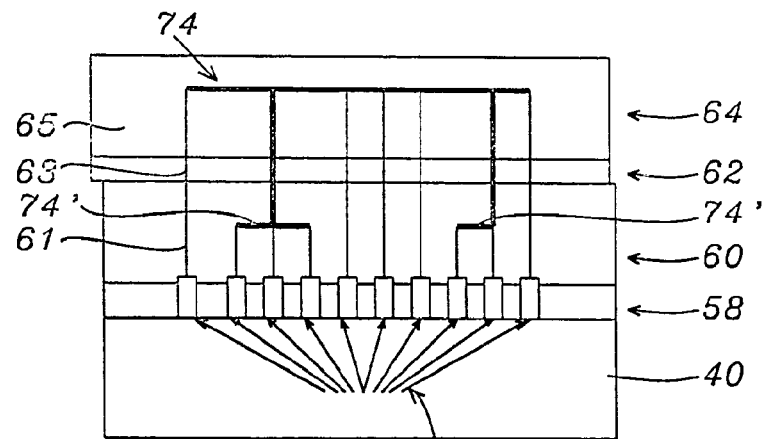
FIG. 5b shows clock and signal distribution lines that are below a layer of passivation and clock and signal distribution lines that are above a layer of passivation.

FIG. 5b provides further insight into the creation of the signal and clock interconnect lines of the invention whereby these interconnect lines have been shown with interconnect lines 74 and interconnect lines 74'. Interconnect lines 74 have been created above the layer 62 of passivation and can act as global signal and clock interconnect lines. Interconnect lines 74' have been created below the layer 62 of passivation and act as local signal and clock interconnect lines.

It must further be emphasized that, where FIGS. 3-5 show a fine-line interconnect network in the layer 60 that underlies the layer 62 of passivation, the invention also enables and can be further extended with the complete elimination of the fine-line interconnect network in the layer 60, however, creating an interconnect network in the layer 64 that uses only thick, wide wires. For this application of the invention, the first layer of dielectric 60 is not applied, and the layer 62 of passivation is deposited directly over the surface of the created semiconductor devices 42 in or on the surface of substrate 40.

It is further of value to briefly discuss the above implemented and addressed distinction between fine-line interconnect lines and wide, thick interconnect lines. The following points apply in this respect:

the prior art fine line interconnect lines are created underneath a layer of passivation, the wide, thick interconnect lines of the invention are created above a layer of passivation the fine-line interconnect lines are typically created in a layer of inorganic dielectric, the thick wide interconnect lines are typically created in a layer of dielectric comprising polymer. This is because an inorganic material cannot be deposited as a thick layer of dielectric because such a layer of dielectric would develop fissures and crack as a result fine-line interconnect metal is typically created using methods of sputter with resist etching or of damascene processes using oxide etch with electroplating after which CMP is applied. Either one of these two approaches cannot create thick metal due to cost considerations or oxide cracking thick, wide interconnect lines can be created by first sputtering a thin metal base layer, coating and patterning a thick layer of photoresist, applying a thick layer of metal by electroplating, removing the patterned thick layer of photoresist and performing metal base etching (of the sputtered thin metal base layer). This method allows for the creation of a pattern of very thick metal, and metal thickness in excess of 1 μm can in this manner be achieved while the thickness of the layer of dielectric in which the thick metal interconnect lines are created can be in excess of 2 μm.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A chip comprising:
   a silicon substrate;
   a first internal circuit in or on said silicon substrate;
   a second internal circuit in or on said silicon substrate;
   a third internal circuit in or on said silicon substrate;
   a dielectric layer over said silicon substrate;
   a first local ground distribution network over said silicon substrate and in said dielectric layer, wherein said first local ground distribution network is connected to said first internal circuit and to said second internal circuit, and wherein said first internal circuit is connected to said second internal circuit through said first local ground distribution network;
   a second local ground distribution network over said silicon substrate and in said dielectric layer, wherein said second local ground distribution network is connected to said third internal circuit;
   a passivation layer over said dielectric layer;
   a first via in said passivation layer, wherein said first via is connected to said first local ground distribution network;
   a second via in said passivation layer, wherein said second via is connected to said second local ground distribution network; and
   a global ground distribution network over said passivation layer, wherein said global ground distribution network is connected to said first and second vias, and wherein said first and second internal circuits are connected to said third internal circuit through, in sequence, said first local ground distribution network, said first via, said global ground distribution network, said second via and said second local ground distribution network.

2. The chip of claim 1 further comprising a fourth internal circuit in or on said silicon substrate, wherein said first local ground distribution network is connected to said fourth internal circuit, wherein said first and second internal circuits are connected to said fourth internal circuit through said first local ground distribution network, and wherein said fourth internal circuit is connected to said third internal circuit through, in sequence, said first local ground distribution network, said first via, said global ground distribution network, said second via and said second local ground distribution network.

3. The chip of claim 1 further comprising a fourth internal circuit in or on said silicon substrate, a third local ground distribution network over said silicon substrate and in said dielectric layer, wherein said third local ground distribution network is connected to said fourth internal circuit, and a third via in said passivation layer, wherein said third via is connected to said third local ground distribution network and to said global ground distribution network, wherein said first and second internal circuits are connected to said fourth internal circuit through, in sequence, said first local ground distribution network, said first via, said global ground distribution network, said third via and said third local ground distribution network, and wherein said third internal circuit is connected to said fourth internal circuit through, in sequence, said second local ground distribution network, said second via, said global ground distribution network, said third via and said third local ground distribution network.

4. The chip of claim 1 further comprising an ESD circuit in or on said silicon substrate, wherein said ESD circuit is connected to said first, second and third internal circuits through said global ground distribution network.

5. The chip of claim 1 further comprising a polymer layer over said passivation layer, wherein said global ground distribution network is in said polymer layer.

6. The chip of claim 5, wherein said polymer layer has a thickness greater than 2 micrometers.

7. The chip of claim 1, wherein said global ground distribution network comprises an interconnecting line having a thickness greater than 1 micrometer.

8. The chip of claim 1, wherein said passivation layer comprises a topmost nitride layer of said chip.

9. The chip of claim 1, wherein said passivation layer comprises a nitride layer and an oxide layer.

10. A chip comprising:
a silicon substrate;
a first internal circuit in or on said silicon substrate;
a second internal circuit in or on said silicon substrate;
a third internal circuit in or on said silicon substrate;
a fourth internal circuit in or on said silicon substrate;
a dielectric layer over said silicon substrate;
a first local ground distribution network over said silicon substrate and in said dielectric layer, wherein said first local ground distribution network is connected to said first internal circuit and to said second internal circuit, and wherein said first internal circuit is connected to said second internal circuit through said first local ground distribution network;
a second local ground distribution network over said silicon substrate and in said dielectric layer, wherein said second local ground distribution network is connected to said third internal circuit and to said fourth internal circuit, and wherein said third internal circuit is connected to said fourth internal circuit through said second local ground distribution network;
a passivation layer over said dielectric layer, wherein said passivation layer comprises a topmost nitride layer of said chip;
a first via in said passivation layer, wherein said first via is connected to said first local ground distribution network;
a second via in said passivation layer, wherein said second via is connected to said second local ground distribution network; and
a global ground distribution network over said passivation layer, wherein said global ground distribution network is connected to said first and second vias, and wherein said first and second internal circuits are connected to said third and fourth internal circuits through, in sequence, said first local ground distribution network, said first via, said global ground distribution network, said second via and said second local ground distribution network.

11. The chip of claim 10 further comprising a fifth internal circuit in or on said silicon substrate, wherein said first local ground distribution network is connected to said fifth internal circuit, wherein said first and second internal circuits are connected to said fifth internal circuit through said first local ground distribution network, and wherein said fifth internal circuit is connected to said third and fourth internal circuits through, in sequence, said first local ground distribution network, said first via, said global ground distribution network, said second via and said second local ground distribution network.

12. The chip of claim 10 further comprising a fifth internal circuit in or on said silicon substrate, a third local ground distribution network over said silicon substrate and in said dielectric layer, wherein said third local ground distribution network is connected to said fifth internal circuit, and a third via in said passivation layer, wherein said third via is connected to said third local ground distribution network and to said global ground distribution network, wherein said first and second internal circuits are connected to said fifth internal circuit through, in sequence, said first local ground distribution network, said first via, said global ground distribution network, said third via and said third local ground distribution network, and wherein said third and fourth internal circuits are connected to said fifth internal circuit through, in sequence, said second local ground distribution network, said second via, said global ground distribution network, said third via and said third local ground distribution network.

13. The chip of claim 10 further comprising an ESD circuit in or on said silicon substrate, wherein said ESD circuit is connected to said first, second, third and fourth internal circuits through said global ground distribution network.

14. The chip of claim 10 further comprising a polymer layer over said passivation layer, wherein said global ground distribution network is in said polymer layer.

15. The chip of claim 14, wherein said polymer layer has a thickness greater than 2 micrometers.

16. The chip of claim 10, wherein said global ground distribution network comprises an interconnecting line having a thickness greater than 1 micrometer.

* * * * *